United States Patent
Ko

(10) Patent No.: US 8,234,781 B2
(45) Date of Patent: Aug. 7, 2012

(54) PRINTED CIRCUIT BOARD AND METHOD OF FABRICATING THE SAME

(75) Inventor: Young Gwan Ko, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 337 days.

(21) Appl. No.: 12/559,443

(22) Filed: Sep. 14, 2009

(65) Prior Publication Data

US 2011/0024176 A1 Feb. 3, 2011

(30) Foreign Application Priority Data

Jul. 31, 2009 (KR) .................. 10-2009-0070634

(51) Int. Cl.
*H01R 9/00* (2006.01)
*H05K 3/00* (2006.01)
(52) U.S. Cl. .............. 29/842; 29/831; 29/846; 174/255; 174/261; 361/761; 361/784
(58) Field of Classification Search .................. 29/829, 29/830, 831, 842, 846; 174/250, 255, 261–264; 361/760, 761, 784
See application file for complete search history.

(56) References Cited

U.S. PATENT DOCUMENTS

| | | | |
|---|---|---|---|
| 3,042,591 A * | 7/1962 | Cado .......................... | 205/125 |
| 2007/0143992 A1 * | 6/2007 | Kyouzuka ....................... | 29/830 |

FOREIGN PATENT DOCUMENTS

| | | |
|---|---|---|
| JP | 2006-080571 | 3/2003 |
| JP | 2005-236244 | 9/2005 |
| JP | 2007-173775 | 7/2007 |
| JP | 2009-021547 | 1/2009 |
| KR | 100619346 | 8/2006 |
| KR | 1020090032836 | 4/2009 |

OTHER PUBLICATIONS

Office Action from counterpart Japanese Patent Application No. 2009-213185 dated Aug. 16, 2011, 4 pages.
Office Action from counterpart Korean Patent Application No. 10-2009-0070634 Jan. 3, 2011, 3 pages.

* cited by examiner

*Primary Examiner* — A. Dexter Tugbang
*Assistant Examiner* — Jeffrey T Carley
(74) *Attorney, Agent, or Firm* — Blakely, Sokoloff, Taylor & Zafman, LLP

(57) ABSTRACT

Disclosed is a printed circuit board, which includes an insulating member having a circuit pattern embedded in one surface thereof, a build-up layer formed on one surface of the insulating member and including a build-up insulating layer and a circuit layer formed in the build-up insulating layer and having a via connected to the circuit pattern, and a solder resist layer formed on the build-up layer. A method of fabricating the printed circuit board is also provided. The printed circuit board is fabricated using a build-up process and the outermost circuit layer thereof is formed to have an embedded structure using an imprinting process, thus minimizing the separation of the circuit layer and reducing the lead time and the fabrication cost.

7 Claims, 15 Drawing Sheets

US 8,234,781 B2

PRINTED CIRCUIT BOARD AND METHOD OF FABRICATING THE SAME

CROSS REFERENCE TO RELATED APPLICATION

This application claims the benefit of Korean Patent Application No. 10-2009-0070634, filed Jul. 31, 2009, entitled "A printed circuit board and a fabricating method the same", which is hereby incorporated by reference in its entirety into this application.

BACKGROUND OF THE INVENTION

1. Technical Field

The present invention relates to a printed circuit board (PCB) and a method of fabricating the same.

2. Description of the Related Art

Recently, in order to cope with an increase both in signal transmission speed and density of a semiconductor chip, the demand for techniques for directly mounting a semiconductor chip on a PCB is increasing. Thus, the development of a PCB having high density and high reliability capable of coping with the increase in the density of the semiconductor chip is required.

The requirements for the PCB having high density and high reliability are closely related to the specs of the semiconductor chip, and may include for example circuit fineness, high electrical properties, high signal transmission structure, high reliability, high functionality and so on. Hence, there is a need for techniques for fabricating the PCB having a fine circuit pattern and micro via holes in accordance with such requirements.

Typically, examples of a method of forming the circuit pattern of the PCB include a subtractive process, a full additive process, and a semi-additive process. Among them, a semi-additive process enabling the fineness of the circuit pattern is currently receiving attention.

FIGS. 1 to 6 are cross-sectional views sequentially showing a process of forming the circuit pattern using a semi-additive process according to an embodiment of a conventional technique. With reference to these drawings, the method of forming the circuit pattern is described below.

As shown in FIG. 1, a via hole 16 is processed in an insulating layer 12 having a metal layer 14 formed on one surface thereof.

Next, as shown in FIG. 2, an electroless plating layer 18 is formed on both the insulating layer 12 and the inner wall of the via hole 16. The electroless plating process functions as a pretreatment procedure of a subsequent electroplating process, and the electroless plating layer 18 should be provided at a predetermined thickness or more (e.g. 1 μm or more) in order to form an electroplating layer 24.

Next, as shown in FIG. 3, a dry film 20 is placed thereon, and is then patterned to have an opening 22 for exposing a circuit pattern forming region.

Next, as shown in FIG. 4, the electroplating layer 24 is formed in both the opening 22 and the via hole 16.

Next, as shown in FIG. 5, the dry film 20 is removed.

Finally, as shown in FIG. 6, a portion of the electroless plating layer 18 on which the electroplating layer 24 is not formed is removed through flash etching, quick etching or the like, thus forming the circuit pattern 28 including a via 26.

However, because the circuit pattern 28 resulting from the conventional semi-additive process is provided in the form of a positive pattern on the insulating layer 12, it may be undesirably separated from the insulating layer 12. In particular, as the circuit pattern 28 becomes finer, the contact area between the insulating layer 12 and the circuit pattern 28 is reduced, thus weakening adhesivity therebetween, so that the circuit pattern 28 is easily separated. In a multilayered PCB, the separation of the circuit pattern 28 formed on the outermost layer drastically deteriorates the reliability of the PCB.

With the recent goal of overcoming the above problem, a new process is proposed. For example, there is LPP (Laser Patterning Process) including forming a trench in an insulating layer using a laser and performing plating, polishing and etching thus forming a circuit pattern.

FIGS. 7 to 10 are cross-sectional views sequentially showing a process of forming the circuit pattern using LPP according to another embodiment of a conventional technique.

First, as shown in FIG. 7, a trench 56 including a circuit pattern trench 56a and a bump pad trench 56b is processed using a laser in an insulating layer 52 having a metal layer 54 formed on one surface thereof.

Next, as shown in FIG. 8, an electroless plating layer 58 is formed on both the insulating layer 52 and the inner wall of the trench 56.

Next, as shown in FIG. 9, an electroplating layer 60 is formed on the electroless plating layer 58.

Finally, as shown in FIG. 10, portions of the electroless plating layer 58 and the electroplating layer 60, which are protruding from the upper surface of the insulating layer, are removed through etching or grinding, thus forming an embedded circuit pattern 64 having a via 62.

In the case where the PCB is fabricated using LPP, the circuit pattern 64 is embedded and thus the separation thereof may be advantageously prevented. However, in order to reduce plating deviation occurring between the region having the trench 56 and the region having no trench, an additional polishing process should be performed, and also, trench processing and polishing should be conducted in respective layers, undesirably prolonging the lead time. Furthermore, because equipment used in the formation of the trench is expensive, the fabrication cost is undesirably increased. Therefore, it is difficult to fabricate the multilayered PCB using only LPP.

SUMMARY OF THE INVENTION

Accordingly, the present invention has been made keeping in mind the problems encountered in the related art and the present invention intends to provide a PCB and a method of fabricating the same, in which the PCB is fabricated using a build-up process and the outermost circuit layer thereof is formed to have an embedded structure using a simple imprinting process, thus minimizing the separation of the circuit layer and reducing the lead time and the fabrication cost.

An aspect of the present invention provides a PCB, including an insulating member having a circuit pattern embedded in one surface thereof, a build-up layer formed on one surface of the insulating member and including a build-up insulating layer and a circuit layer formed in the build-up insulating layer and having a via connected to the circuit pattern, and a solder resist layer formed on the build-up layer.

In this aspect, a pattern trench may be formed in one surface of the insulating member using an imprinting process, and thus the circuit pattern may be formed in the pattern trench.

In this aspect, the insulating member may have a bump pad, which is formed to be exposed to the other surface of the insulating member while being connected to the circuit pattern.

Also, a surface treatment layer may be formed on an exposed surface of the bump pad.

Also, a pattern trench may be formed in the insulating member and a bump pad trench may be formed to pass through the insulating member, and thus the circuit pattern may be formed in the pattern trench and the bump pad may be formed in the bump pad trench.

Also, the insulating member may have the bump pad connected to the circuit pattern, and an assistant pad which is formed to be exposed to the other surface of the insulating member while being connected to the bump pad and has a diameter larger than that of the bump pad.

As such, a surface treatment layer may be formed on an exposed surface of the assistant pad.

In this aspect, a first opening for exposing a first pad of the circuit layer may be formed in the solder resist layer, and a second opening for exposing a second pad of the circuit pattern may be formed in the insulating member.

Another aspect of the present invention provides a method of fabricating the PCB, including (A) applying an insulating member on a carrier, and then processing a pattern trench in the insulating member using an imprinting process, (B) performing plating in the pattern trench, thus forming a circuit pattern, (C) forming a build-up insulating layer on the insulating member, and then forming a circuit layer having a via for interlayer connection, and (D) forming a solder resist layer on the build-up insulating layer, and then removing the carrier.

In this aspect, in (D), processing in the solder resist layer a first opening for exposing a first pad of the circuit layer may be performed.

In this aspect, the method may further include (E) processing in the insulating member a second opening for exposing a second pad of the circuit pattern, after (D).

Also, the method may further include (F) forming a surface treatment layer on the pad, after (E).

A further aspect of the present invention provides a method of fabricating the PCB, including (A) applying an insulating member on a carrier, and then processing a pattern trench in the insulating member and a bump pad trench passing through the insulating member using an imprinting process, (B) performing plating in the pattern trench and the bump pad trench, thus forming a circuit pattern and a bump pad, (C) forming a build-up insulating layer on the insulating member, and then forming a circuit layer having a via for interlayer connection, and (D) forming a solder resist layer on the build-up insulating layer, and then removing the carrier.

In this aspect, in (D), processing in the solder resist layer a first opening for exposing a first pad of the circuit layer may be performed.

In this aspect, the method may further include (E) forming a surface treatment layer on an exposed surface of the bump pad, after (D).

In this aspect, the method may further include (E1) processing a recess in a portion of the bump pad and a portion of the insulating member around the portion of the bump pad in a thickness direction, and (E2) performing plating in the recess thus forming an assistant pad, after (D).

Also, the method may further include (E3) forming a surface treatment layer on the assistant pad, after (E2).

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
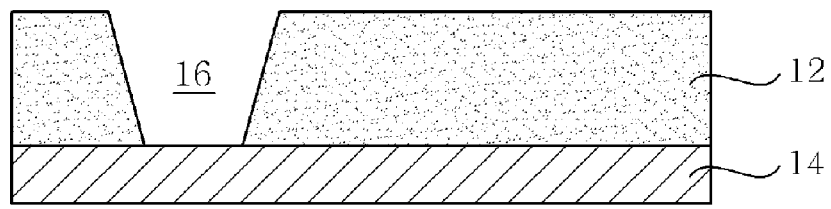
FIGS. 1 to 6 are cross-sectional views sequentially showing a process of forming a circuit pattern using a semi-additive process according to an embodiment of a conventional technique.
Figure 2:
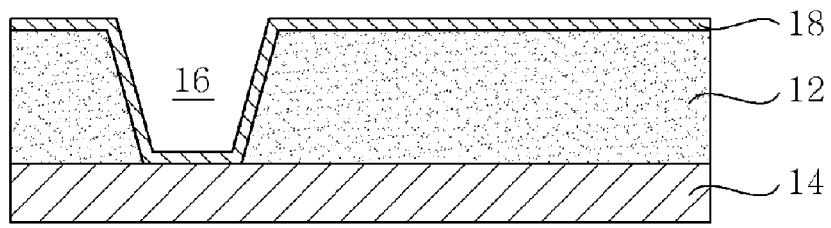
Figure 3:
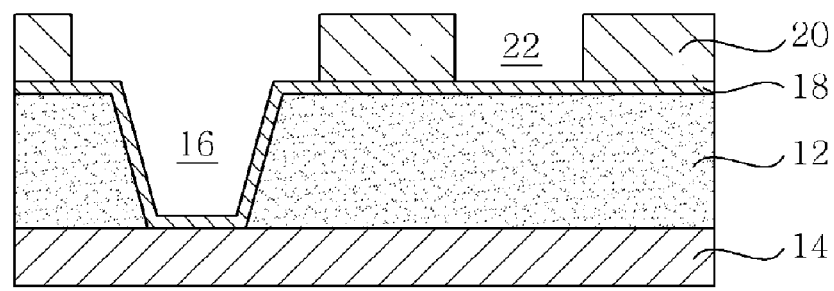
Figure 4:
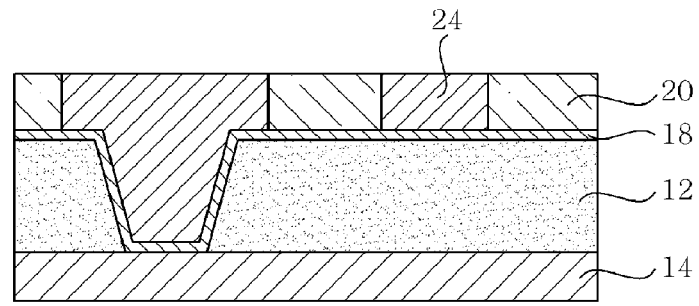
Figure 5:
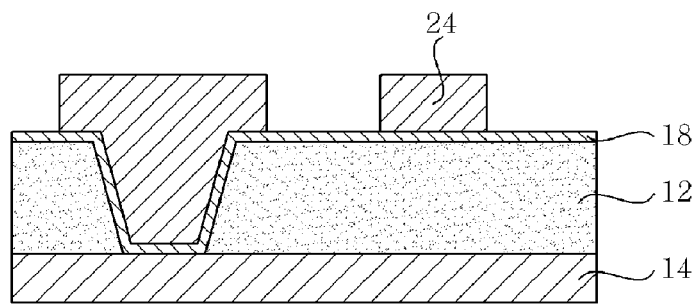
Figure 6:
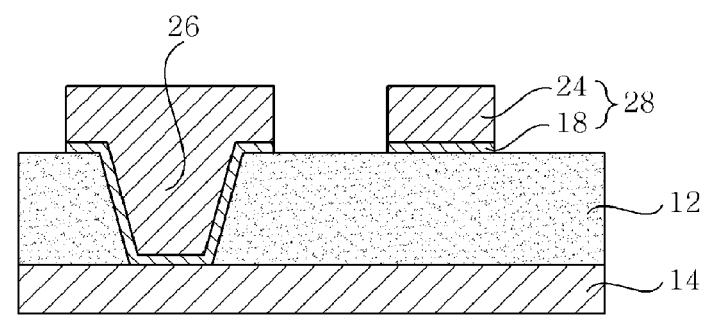
Figure 7:
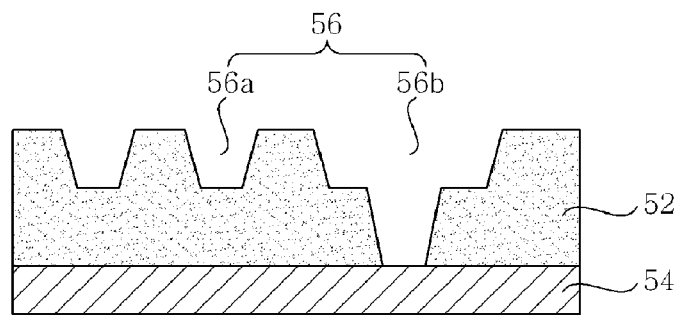
FIGS. 7 to 10 are cross-sectional views sequentially showing a process of forming a circuit pattern using LPP according to another embodiment of a conventional technique.
Figure 8:
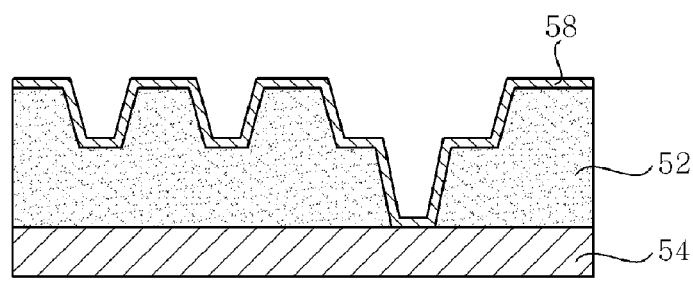
Figure 9:
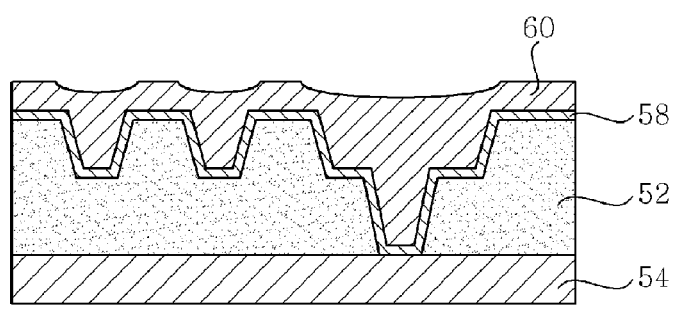
Figure 10:
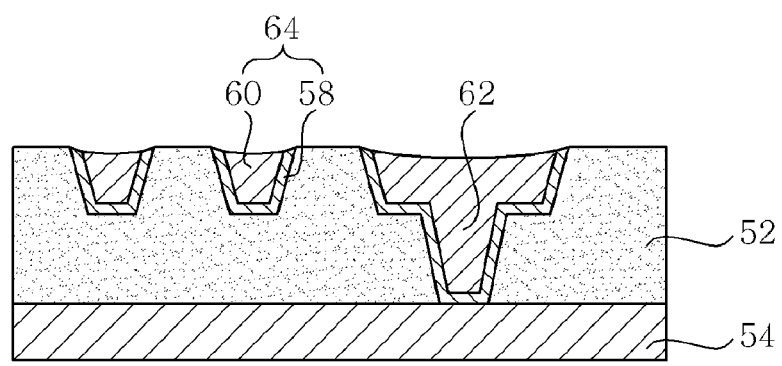

Hereinafter, a detailed description will be given of embodiments of the present invention with reference to the accompanying drawings. Throughout the drawings, the same reference numerals refer to the same or similar elements, and redundant descriptions are omitted. In the description, in the case where known techniques pertaining to the present invention are regarded as unnecessary because they make the characteristics of the invention unclear and also for the sake of description, the detailed descriptions thereof may be omitted.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Figure 11:
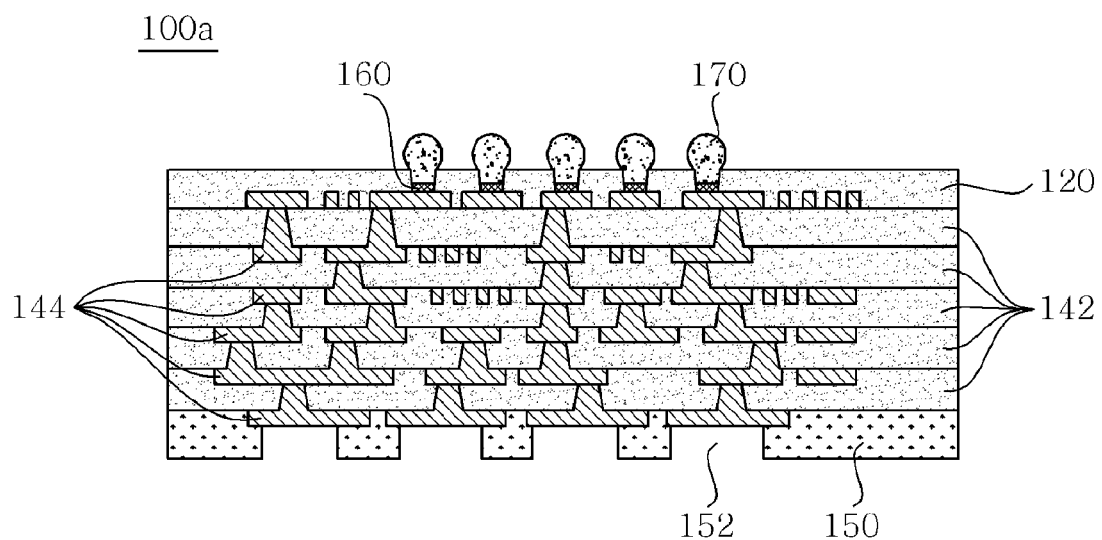
FIG. 11 is a cross-sectional view showing a PCB according to a first embodiment of the present invention.

FIG. 11 is a cross-sectional view showing a PCB according to a first embodiment of the present invention. With reference to this drawing, the PCB 100a according to the present embodiment is described below.

As shown in FIG. 11, the PCB 100a according to the present embodiment includes an insulating member 120 having a circuit pattern 130 embedded in one surface thereof, a build-up layer 140 formed on the insulating member 120 and including a build-up insulating layer 142 and a circuit layer 144, and a solder resist layer 150 formed on the build-up layer 140.

The circuit pattern 130 is embedded in one surface of the insulating member 120, and specifically, is embedded to be flush with one surface of the insulating member 120. As such, the circuit pattern 130 is formed only in a portion of one surface of the insulating member 120 in a thickness direction. To this end, a pattern trench 122 is formed through an imprinting process and is then subjected to plating, so that the circuit pattern 130 is formed in the pattern trench 122.

Second pads of the circuit pattern 130 are exposed by second openings 124a formed in the insulating member 120, and attached to the second pads are external connection terminals 170 such as solder balls. As such, a surface treatment layer 160 may be formed on the second pads so as to prevent corrosion/oxidation of the second pads and enhance adhesivity to the external connection terminals 170.

The build-up layer 140 is configured such that the build-up insulating layer 142 is formed on one surface of the insulating member 120 in which the circuit pattern 130 is embedded, and the circuit layer 144 having vias for interlayer connection is formed in the build-up insulating layer 142. The circuit layer 144 is formed to protrude from the surface of the build-up layer 140.

The solder resist layer 150 functions to protect the circuit layer 144 formed in the outermost build-up insulating layer 142 from the outside, and is disposed on the build-up insulating layer 142. As such, the solder resist layer 150 has first openings 152 for exposing first pads of the outermost circuit layer 144.

Figure 12:
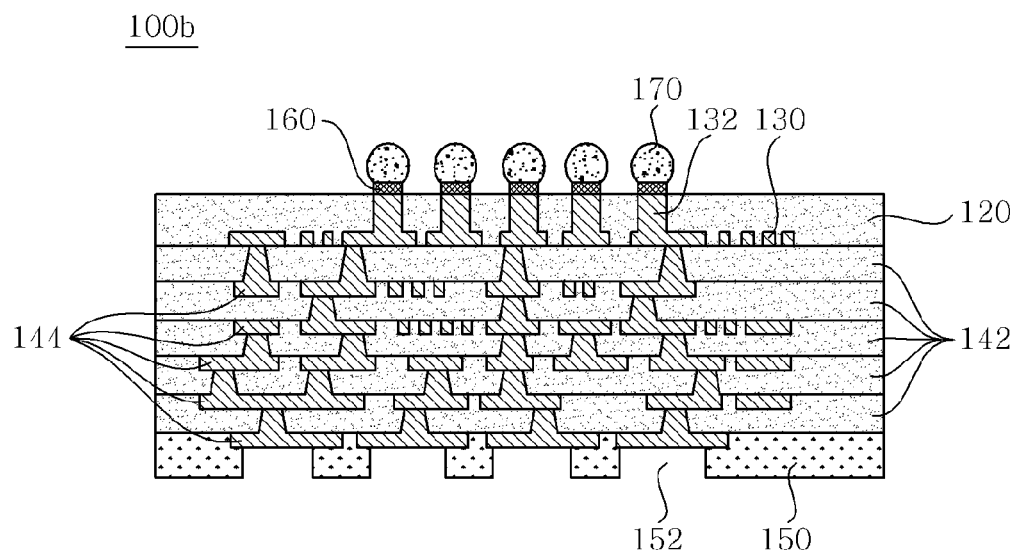
FIG. 12 is a cross-sectional view showing a PCB according to a second embodiment of the present invention.

FIG. 12 is a cross-sectional view showing a PCB according to a second embodiment of the present invention. With reference to this drawing, the PCB 100b according to the present embodiment is described below.

As shown in FIG. 12, the PCB 100b according to the present embodiment has the same configuration as that of the PCB according to the first embodiment, with the exception that bump pads 132 are formed to be exposed to the other surface of an insulating member 120 while being connected to a circuit pattern 130 embedded in one surface of the insulating member 120. The redundant descriptions for the same elements are omitted.

The bump pads 132 are formed to be flush with the other surface of the insulating member 120, and thus have a surface exposed to the other surface of the insulating member 120. Unlike the PCB 100a according to the first embodiment, in the PCB 100b according to the present embodiment, because the bump pads 132 connected to the circuit pattern 130 are formed to extend to the other surface of the insulating member 120, there is no need to process openings in the insulating member 120 to expose pads. In the present embodiment, a surface treatment layer 160 is formed on the exposed surface of the bump pads 132, and external connection terminals 170 are formed on the surface treatment layer.

Figure 13:
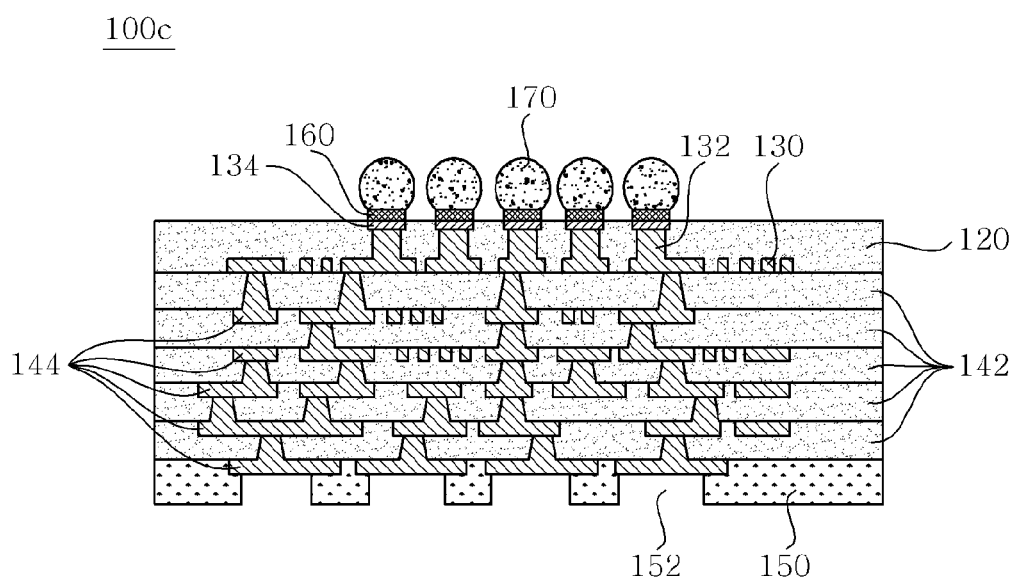
FIG. 13 is a cross-sectional view showing a PCB according to a third embodiment of the present invention.

FIG. 13 is a cross-sectional view showing a PCB according to a third embodiment of the present invention. With reference to this drawing, the PCB 100c according to the present embodiment is described below.

As shown in FIG. 13, the PCB 100c according to the present embodiment is configured such that recesses are processed in portions of the bump pads 132 positioned at the other surface of the insulating member 120 and a portion of the insulating member 120 around the portions of the bump pads 132 in the PCB 100b according the second embodiment, and thus assistant pads 134 connected to the bump pads 132 are formed in the recesses. Specifically, the assistant pads 134 which have a diameter greater than that of the bump pads 132 and are flush with the other surface of the insulating member 120 are provided, whereby the contact area thereof with the external connection terminals 170 is enlarged, thus enhancing adhesivity to the external connection terminals 170. As such, a surface treatment layer 160 may be formed on the assistant pads 134.

FIGS. 14 to 21 are cross-sectional views sequentially showing a process of fabricating the PCB of FIG. 11. Below, the method of fabricating the PCB according to the present embodiment is specified with reference to the above drawings.

Figure 14:
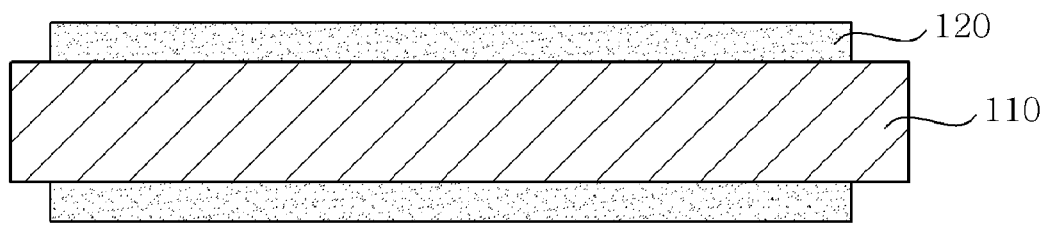
FIGS. 14 to 21 are cross-sectional views sequentially showing a process of fabricating the PCB of FIG. 11.

As shown in FIG. 14, the insulating member 120 is disposed on a carrier 110. The carrier 110 is formed of a material able to perform a supporting function during the fabrication process, and may have an additional release layer thereon so as to facilitate the removal thereof in a subsequent procedure. The insulating member 120 may be formed on either or both surfaces of the carrier 110. Below, the formation of the insulating member 120 on both surfaces of the carrier 110 is illustrative and additional procedures are performed.

Figure 15:
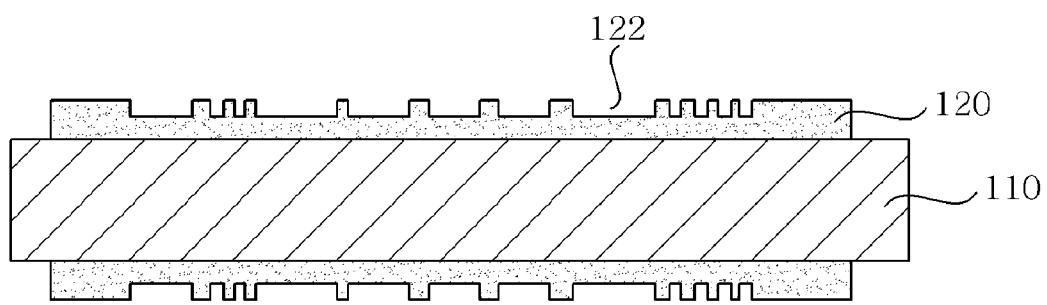

Next, as shown in FIG. 15, the pattern trench 122 is processed in the insulating member 120. The pattern trench 122 is formed by removing a portion of the insulating member 120 in a thickness direction in consideration of the size and thickness of the circuit pattern 130 to be formed. As such, the pattern trench 122 may be formed using for example an imprinting process to reduce the process time and the process cost. The pattern trench 122 may be formed by imprinting the insulating member 120 with an imprint mold having a shape complementary to the shape of the trench.

Figure 16:
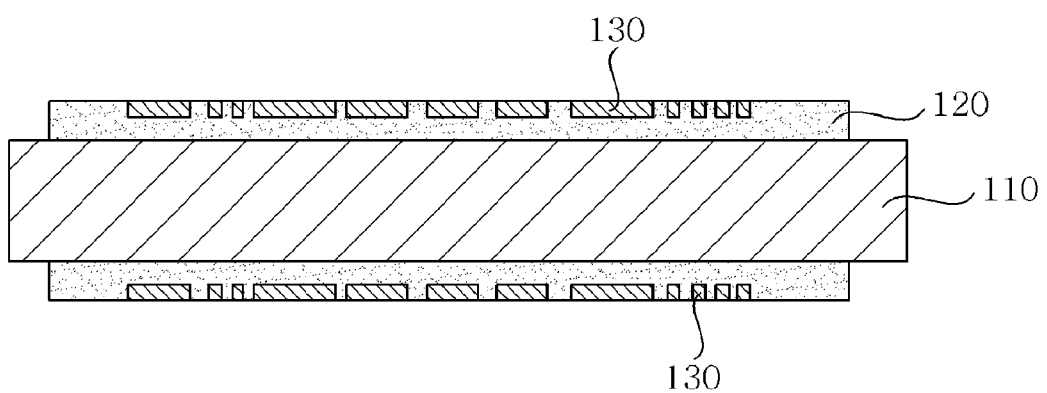

Next, as shown in FIG. 16, a plating process is performed in the pattern trench 122 thus forming the circuit pattern 130. The circuit pattern 130 results from forming an electroless plating layer on both the surface of the insulating member 120 and the inner wall of the pattern trench 122 and then forming an electroplating layer on the portion of the electroless plating layer formed in the pattern trench 122. In the course of forming the plating layer in the pattern trench 122, portions of the electroless plating layer and the electroplating layer, which are formed on the insulating member 120, may be removed through mechanical and/or chemical polishing so that the circuit pattern 130 is flush with one surface of the insulating member 120 (an embedded structure).

Figure 17:
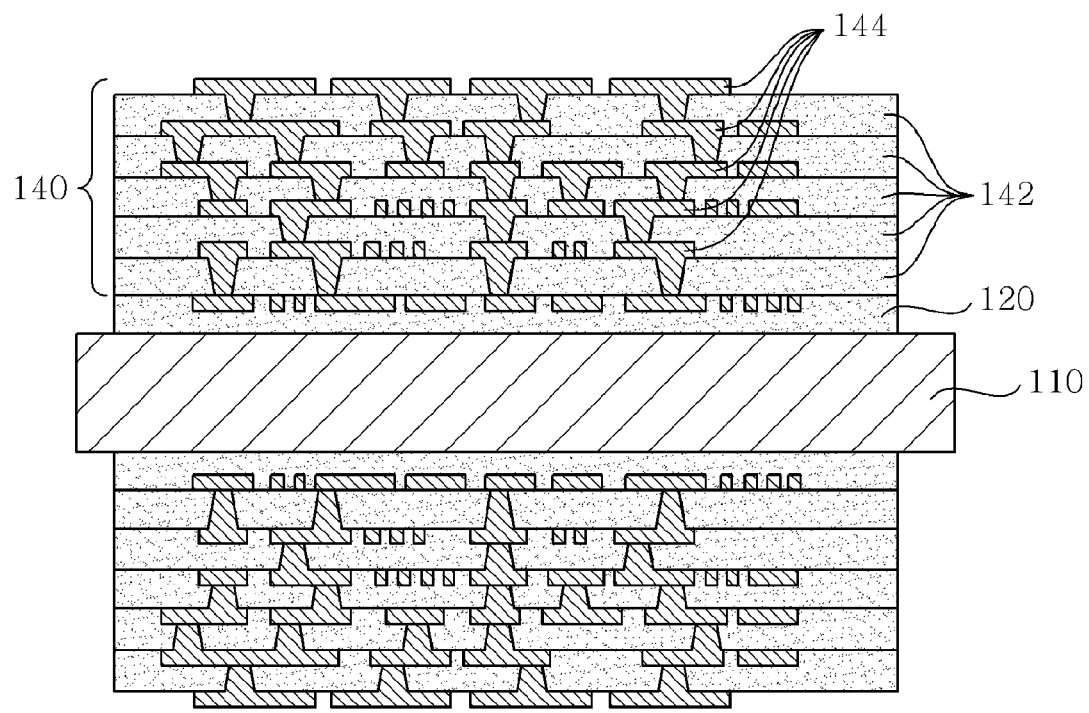

Next, as shown in FIG. 17, the build-up insulating layer 142 is formed on the insulating member 120 having the circuit pattern 130, and the circuit layer 144 having vias for interlayer connection is formed. Namely, the build-up layer 140 is formed through a build-up process. As such, the circuit layer 144 is formed by processing via holes in the build-up insulating layer 142, forming the plating layer on both the build-up insulating layer 142 and the inner walls of the via holes and then patterning the plating layer. The circuit layer 144 formed in the build-up insulating layer 142 directly on the insulating member 120 is connected to the circuit pattern 130 through the vias.

Figure 18:
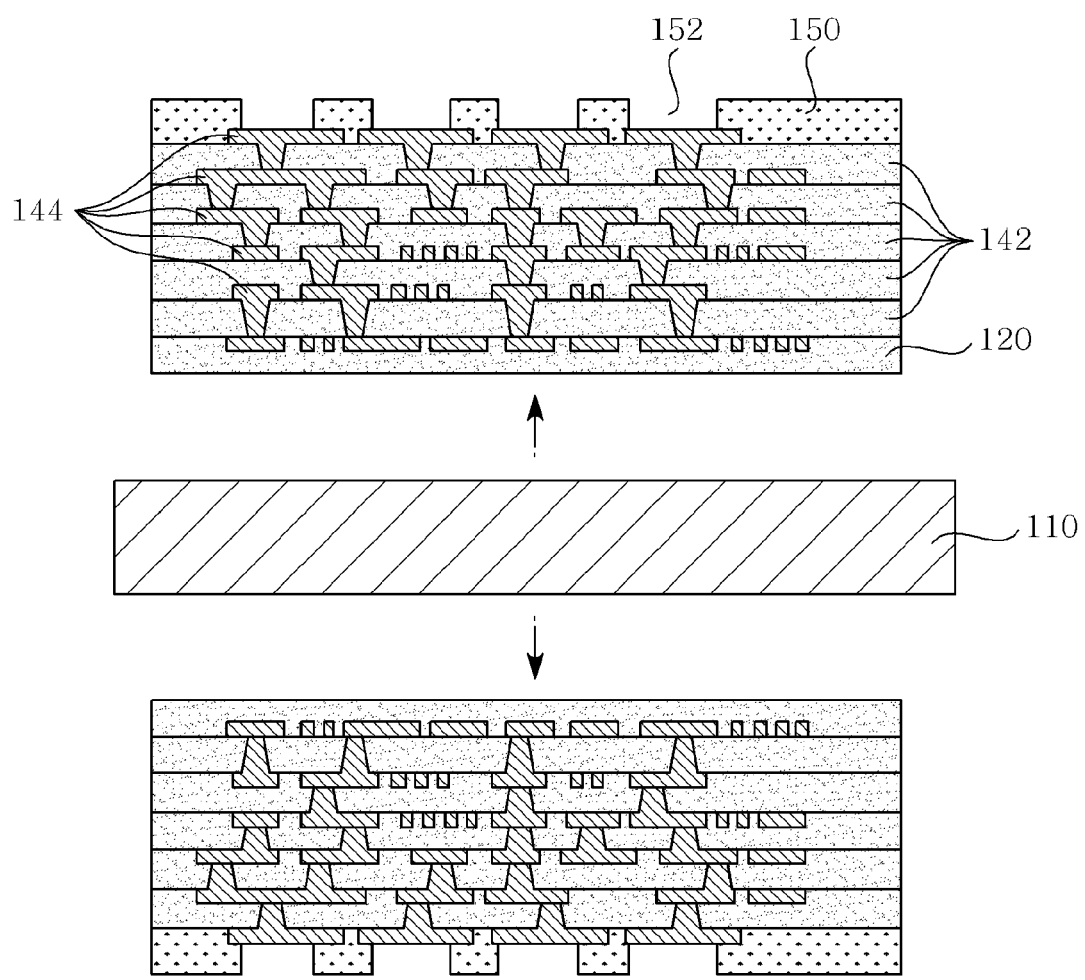

Next, as shown in FIG. 18, the solder resist layer 150 is formed on the build-up insulating layer 142, and the first openings 152 for exposing the first pads of the outermost circuit layer 144 of the build-up insulating layer 142 are processed, after which the carrier 110 is removed. The solder resist layer 150 is formed on the outermost build-up insulating layer 142 in order to protect the outermost circuit layer 144 of the build-up insulating layer 142. The first pads functioning as a connection terminal to the outside are exposed by the first openings 152 formed in the solder resist layer 150 using for example laser direct ablation (LDA).

Figure 19:
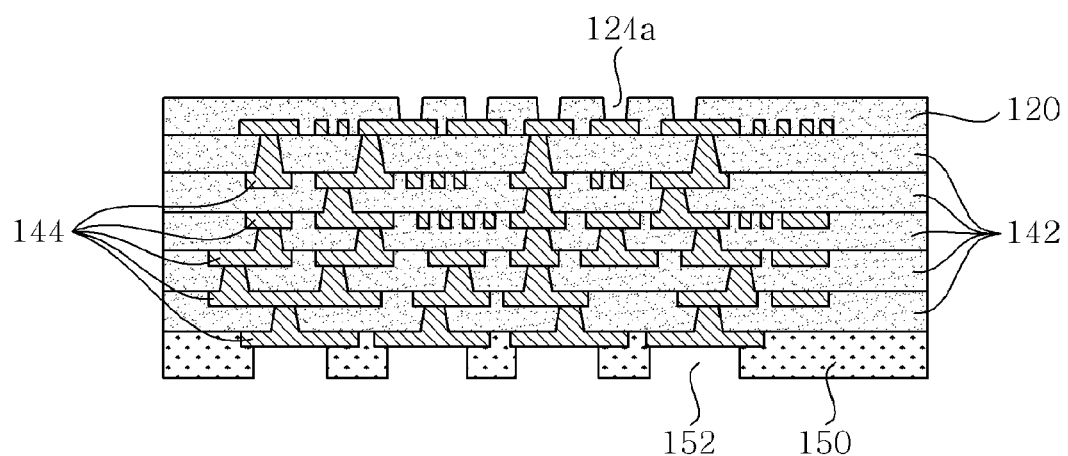

Next, as shown in FIG. 19, the second openings 124a for exposing the second pads of the circuit pattern 130 are processed in the insulating member 120. The second openings 124a may also be formed using LDA as in the formation of the first openings 152. In the present invention, because the insulating member 120 is subjected to subsequent procedures in a state of being formed on the carrier 110, the insulating member 120 may have a flat structure even after formation of the trench and formation of the circuit. Thus, process error occurring between the second openings 124a and the second pads may be minimized. Also, in the present invention, because the circuit pattern 130 is embedded in one surface of the insulating member 120, the insulating member 120 performs a function of protecting the circuit pattern 130 from the outside, thus obviating an additional need to form the solder resist layer.

Figure 20:
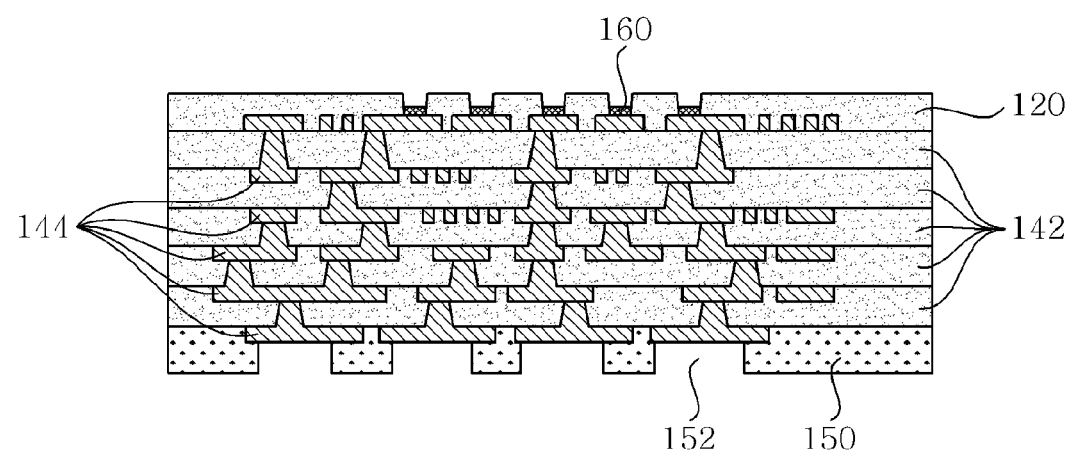

Next, as shown in FIG. 20, the surface treatment layer 160 is formed on the second pads exposed by the second openings 124a. The surface treatment layer 160 functions to prevent the corrosion and oxidation of the exposed second pads, and the formation of the surface treatment layer may be optionally performed depending on the needs. For example, the surface treatment layer 160 may be composed of a nickel (Ni) plating layer or a Ni alloy plating layer with or without having formed thereon any one selected from among a palladium (Pd) plating layer, a gold (Au) plating layer and sequentially disposed Pd plating layer and Au plating layer, and is formed thin.

Figure 21:
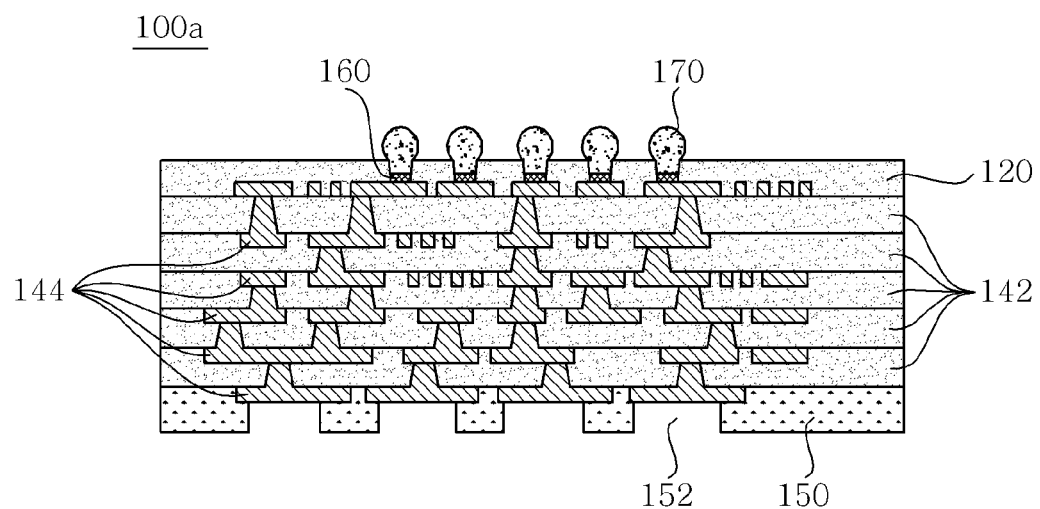

Finally, as shown in FIG. 21, the external connection terminals 170 such as solder balls are formed on the second pads, thereby completing the fabrication of the PCB 100a of FIG. 11. As such, the external connection terminals play a role as a conductive connection terminal for connecting the PCB to an external system, and may be formed by printing a solder paste on the second openings 124a and then performing a reflow process.

FIGS. 22 to 28 are cross-sectional views sequentially showing a process of fabricating the PCB of FIG. 12. Below, the method of fabricating the PCB according to the present embodiment is specified with reference to the above drawings. In the description of the present embodiment, elements which are the same as or similar to those of the previous embodiment are designated by the same reference numerals, and redundant descriptions are omitted.

Figure 22:
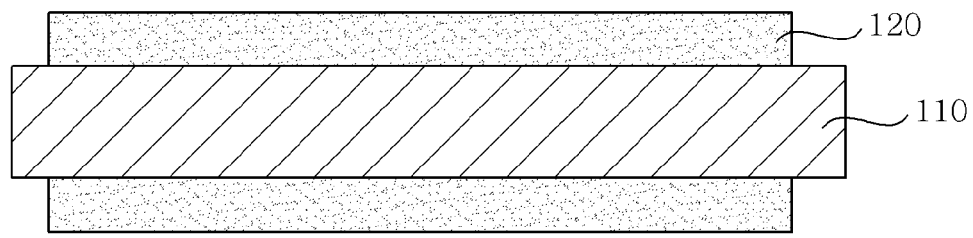
FIGS. 22 to 28 are cross-sectional views sequentially showing a process of fabricating the PCB of FIG. 12.

As shown in FIG. 22, the insulating member 120 is applied on a carrier 110 responsible for a supporting function during the fabrication process.

Figure 23:
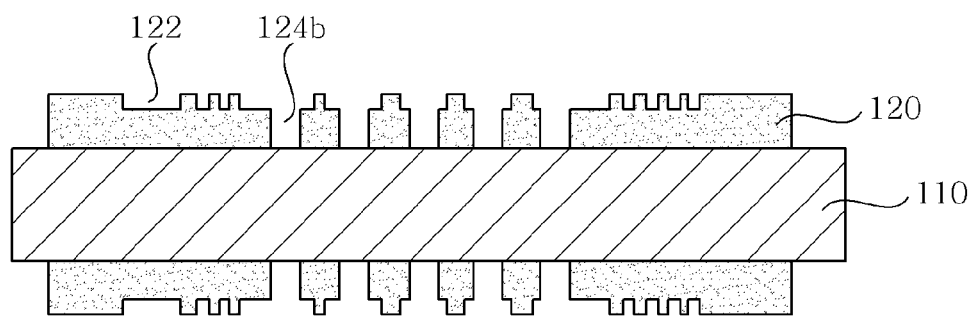

Next, as shown in FIG. 23, a pattern trench 122 and bump pad trenches 124b are processed in the insulating member 120.

The pattern trench 122 is formed in a portion of the insulating member 120 in a thickness direction in consideration of the size and thickness of the circuit pattern 130 to be formed, and the bump pad trenches 124b are formed to pass through the insulating member 120.

Figure 24:
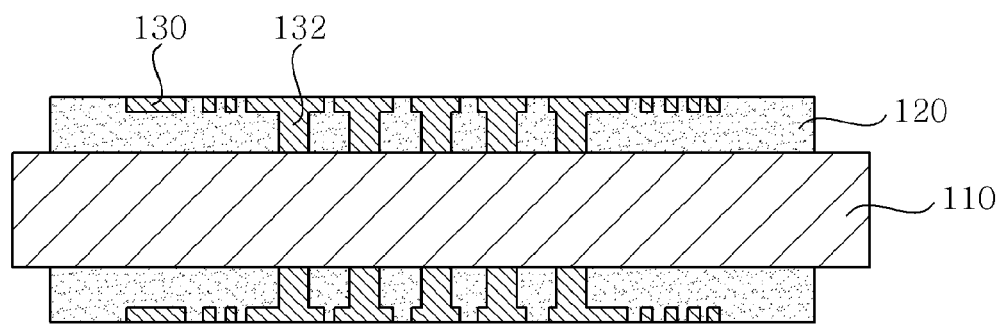

Next, as shown in FIG. 24, a plating process is performed in the pattern trench 122 and the bump pad trenches 124b, thus respectively forming the circuit pattern 130 and the bump pads 132. As such, the circuit pattern 130 is formed to be flush with one surface of the insulating member 120 (an embedded structure), and the bump pads 132 are formed to pass through the other surface of the insulating member 120.

Figure 25:
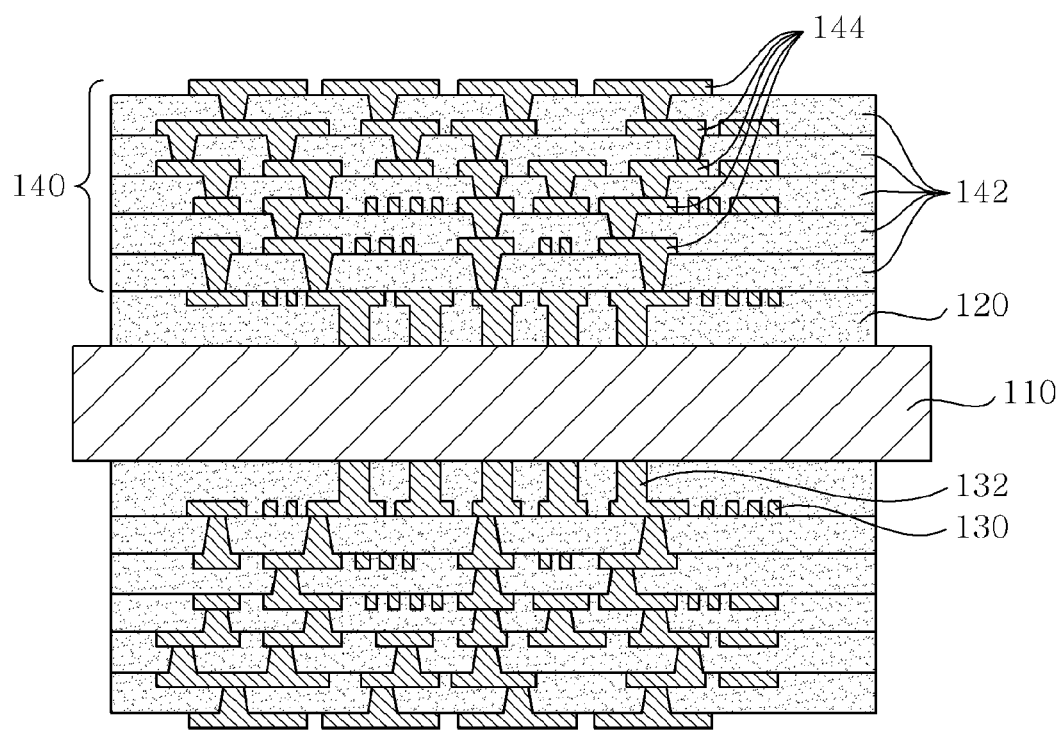

Next, as shown in FIG. 25, the build-up insulating layer 142 is formed on the insulating member 120, and the circuit layer 144 having vias for interlayer connection is formed.

Figure 26:
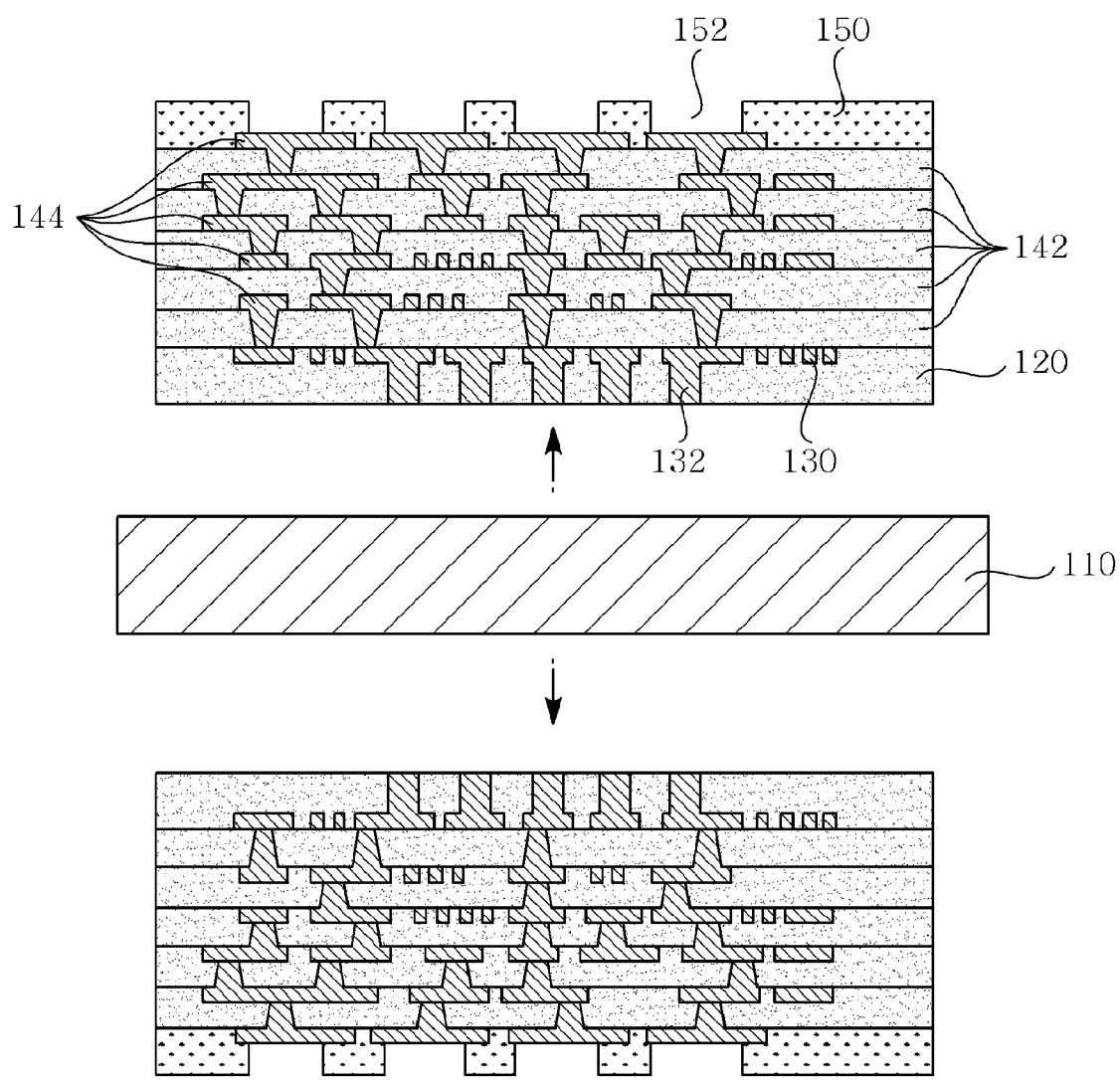

Next, as shown in FIG. 26, the solder resist layer 150 is formed on the build-up insulating layer 142, and the first openings 152 for exposing the first pads of the outermost circuit layer 144 of the build-up insulating layer 142 are processed, after which the carrier 110 is removed.

Figure 27:
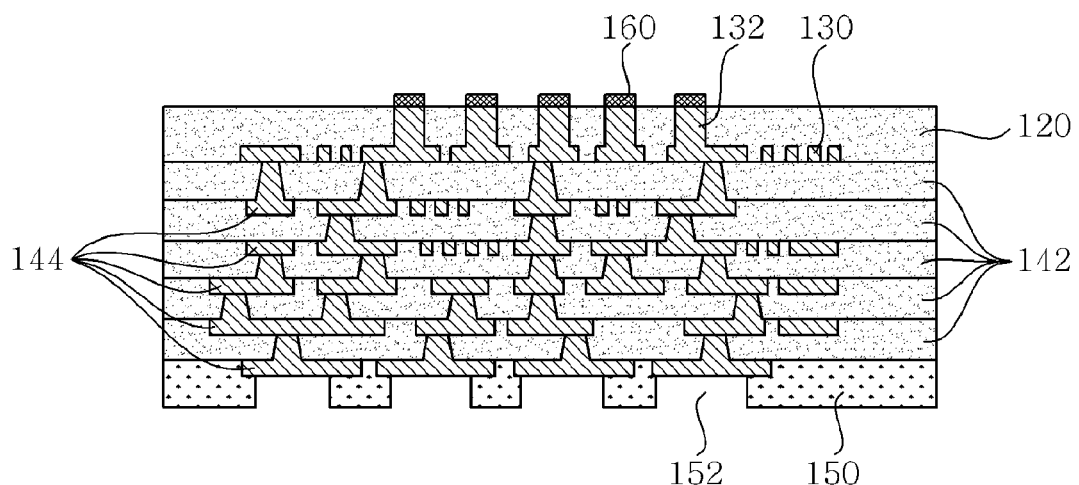

Next, as shown in FIG. 27, the surface treatment layer 160 is formed on the bump pads 132 exposed to the other surface of the insulating member 120. As such, the formation of the surface treatment layer may be optionally performed depending on the needs.

Figure 28:
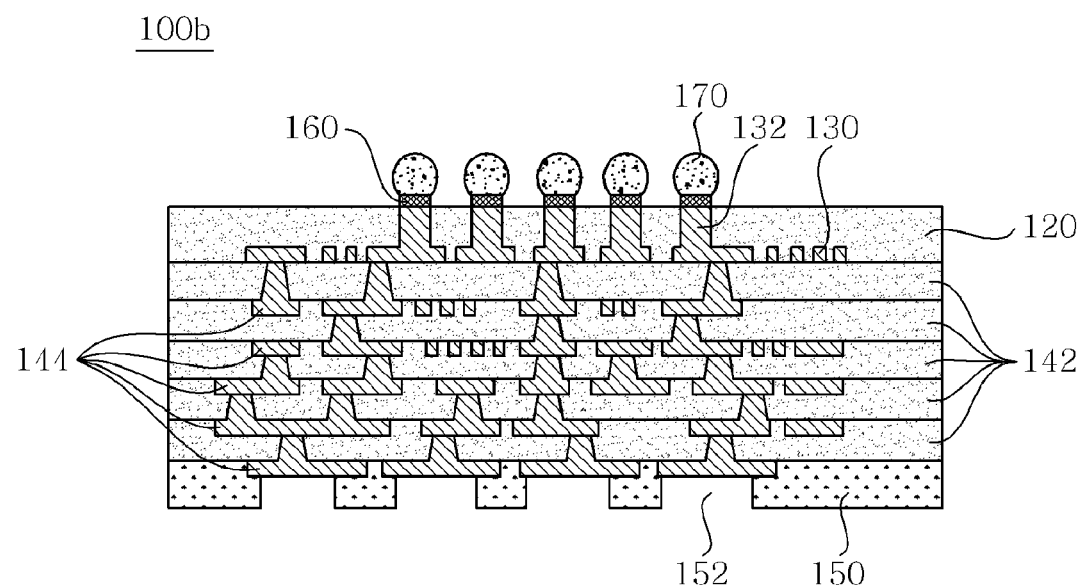

Finally, as shown in FIG. 28, the external connection terminals 170 such as solder balls are formed on the bump pads 132, thereby completing the fabrication of the PCB 100b of FIG. 12.

Figure 29:
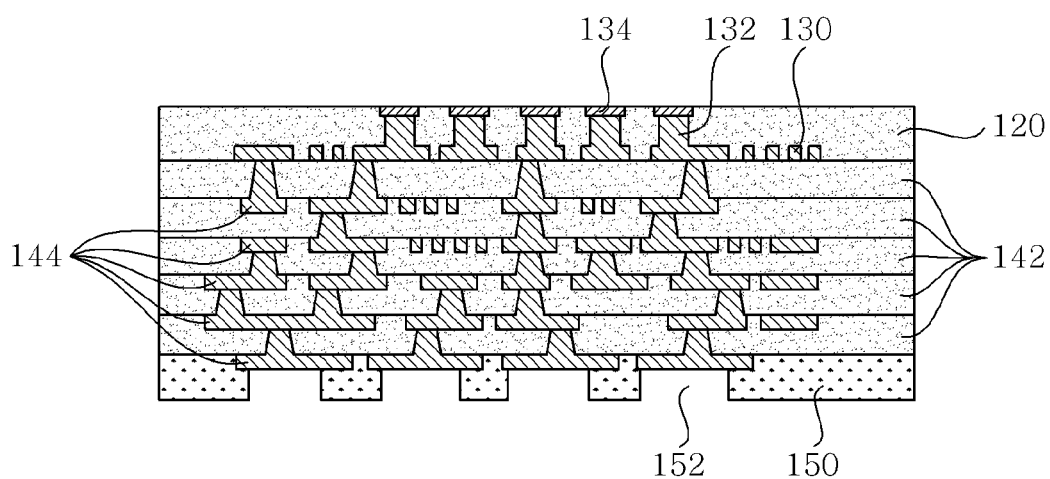
FIGS. 29 to 31 are cross-sectional views sequentially showing a process of fabricating the PCB of FIG. 13.
Figure 30:
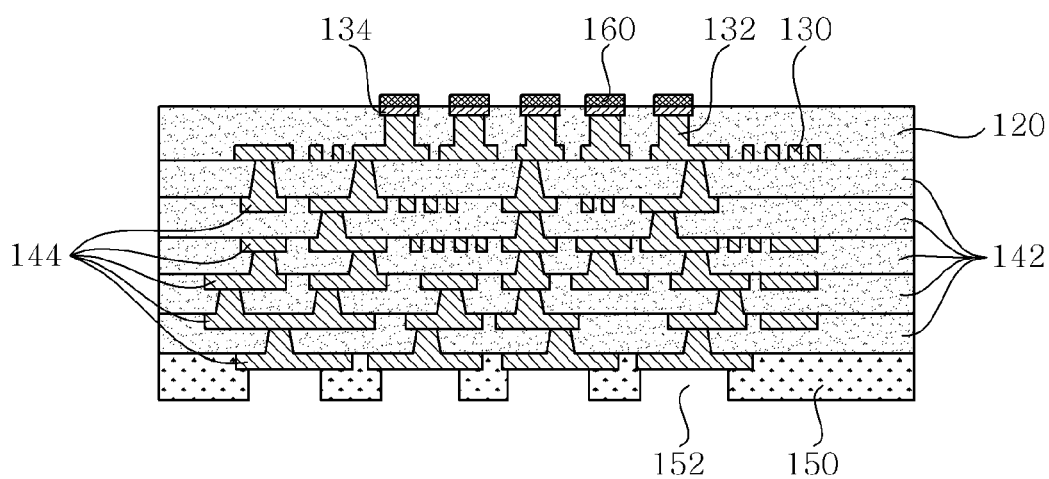
Figure 31:
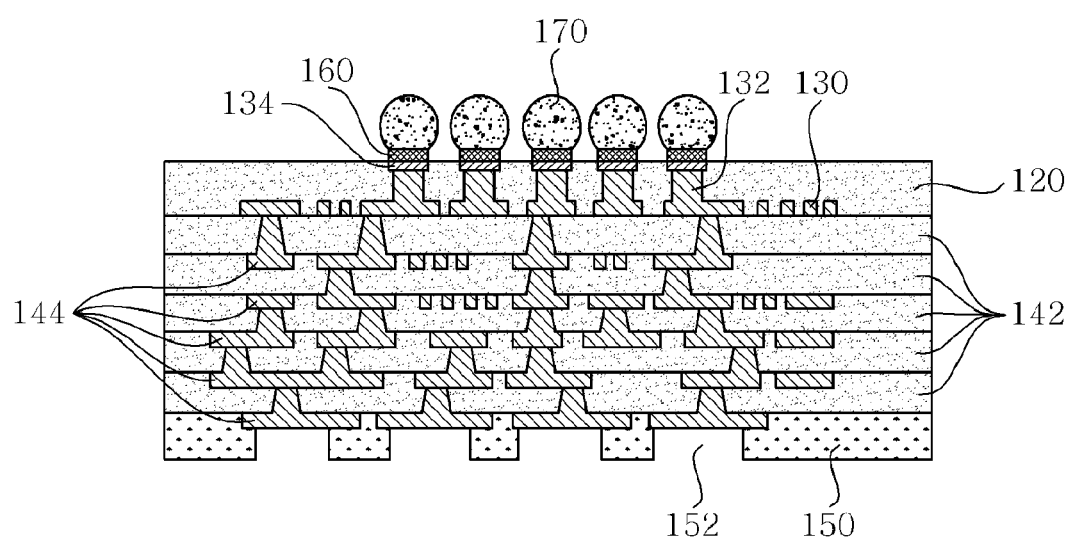

FIGS. 29 to 31 are cross-sectional views sequentially showing a process of fabricating the PCB of FIG. 13. Below, the method of fabricating the PCB according to the present embodiment is specified with reference to these drawings.

As shown in FIG. 29, in the PCB fabricated through the procedures of FIGS. 22 to 26, recesses are processed in both the portions of the bump pads 132 positioned at the other surface of the insulating member 120 and the portion of the insulating member 120 around the portions of the bump pads 132, and are then subjected to a plating process, thus forming the assistant pads 134 which are connected to the bump pads 132. The assistant pads 134 connected to the bump pads 132 have a diameter greater than that of the bump pads 132, so that the contact area with the external connection terminals 170 is increased, thus enhancing adhesivity to the external connection terminals 170.

Next, as shown in FIG. 30, the surface treatment layer 160 is formed on the assistant pads 134.

Finally, as shown in FIG. 31, the external connection terminals 170 such as solder balls are formed on the assistant pads 134, thereby completing the fabrication of the PCB 100c of FIG. 13.

As described hereinbefore, the present invention provides a PCB and a method of fabricating the same. According to the present invention, the PCB is fabricated using a build-up process, and the outermost circuit layer thereof is formed to have an embedded structure using an imprinting process, thus minimizing the separation of the circuit layer and reducing the lead time and the fabrication cost. Furthermore, the build-up process and the imprinting process are employed together, thus solving the interlayer mismatch problem occurring as a result of using only the imprinting process.

Also, according to the present invention, because an insulating member is subjected to subsequent procedures in a state of being supported on a carrier, it is maintained flat even after formation of a circuit of a build-up layer. Hence, when a second opening for exposing a second pad is processed in the insulating member, process error due to the mismatch between the second pad and the second opening may be reduced.

Also, according to the present invention, the insulating member includes a bump pad which is connected to the circuit pattern, thus obviating a process for exposing the pad to the insulating layer.

Also, according to the present invention, an assistant pad able to enlarge the size of the bump pad is formed, thus increasing contact reliability to an external connection terminal.

Although the embodiments of the present invention regarding the PCB and the method of fabricating the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of fabricating a printed circuit board, comprising:
    (A) applying an insulating member on a carrier, and then processing a pattern trench in the insulating member using an imprinting process;
    (B) performing plating in the pattern trench, thus forming a circuit pattern;
    (C) forming a build-up insulating layer on the insulating member, and then forming a circuit layer having a via for interlayer connection; and
    (D) forming a solder resist layer on the build-up insulating layer, and then removing the carrier;
    (E) processing in the insulating member an opening for exposing a pad of the circuit pattern, after (D).

2. The method as set forth in claim 1, wherein, in (D), processing in the solder resist layer a first opening for exposing a first pad of the circuit layer is performed.

3. The method as set forth in claim 1, further comprising (F) forming a surface treatment layer on the pad, after (E).

4. A method of fabricating a printed circuit board, comprising:
- (A) applying an insulating member on a carrier, and then processing a pattern trench in the insulating member and a bump pad trench passing through the insulating member using an imprinting process;
- (B) performing plating in the pattern trench and the bump pad trench, thus forming a circuit pattern and a bump pad;
- (C) forming a build-up insulating layer on the insulating member, and then forming a circuit layer having a via for interlayer connection; and
- (D) forming a solder resist layer on the build-up insulating layer, and then removing the carrier; and,
- (E1) processing a recess in a portion of the bump pad and a portion of the insulating member around the portion of the bump pad in a thickness direction; and (E2) performing plating in the recess thus forming an assistant pad, after (D).

5. The method as set forth in claim 4, wherein, in (D), processing in the solder resist layer a first opening for exposing a first pad of the circuit layer is performed.

6. The method as set forth in claim 4, further comprising (E) forming a surface treatment layer on an exposed surface of the bump pad, after (D).

7. The method as set forth in claim 4, further comprising (E3) forming a surface treatment layer on the assistant pad, after (E2).

* * * * *